(12) United States Patent
Konuk

(10) Patent No.: US 7,065,693 B2
(45) Date of Patent: Jun. 20, 2006

(54) IMPLEMENTATION OF TEST PATTERNS IN AUTOMATED TEST EQUIPMENT

(75) Inventor: Haluk Konuk, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 317 days.

(21) Appl. No.: 10/778,753

(22) Filed: Feb. 13, 2004

(65) Prior Publication Data

US 2005/0193303 A1    Sep. 1, 2005

(51) Int. Cl.
*G06F 11/00* (2006.01)

(52) U.S. Cl. ....................... 714/738; 714/815
(58) Field of Classification Search ............... None
See application file for complete search history.

(56) References Cited

U.S. PATENT DOCUMENTS 6,092,225 A * 7/2000 Gruodis et al. ............ 714/724
6,138,257 A * 10/2000 Wada et al. ................ 714/724
6,651,205 B1 * 11/2003 Takahashi ................... 714/738

* cited by examiner

*Primary Examiner*—Christine T. Tu
(74) *Attorney, Agent, or Firm*—Garlick, Harrison & Markison LLP; Bruce Garlick

(57) ABSTRACT

An improved automated testing system that decreases the number of test signals that must be stored in the tester pattern memory for a timed test pattern. In the present invention, a timed test pattern is controlled by a timing generator operable to change the timing interval of individual test cycles during the timed test pattern between first and second timing intervals, thereby decreasing the number of test signals stored in pattern memory for the timed test pattern. The method and apparatus of the present invention can be implemented to test integrated circuits comprising circuitry operating in first and second time domains wherein the first and second timing intervals of the timed test pattern correspond to the first and second time domains of the circuit, respectively.

20 Claims, 5 Drawing Sheets

IMPLEMENTATION OF TEST PATTERNS IN AUTOMATED TEST EQUIPMENT

BACKGROUND OF THE INVENTION

1. Field of the Invention

The present invention relates generally to the field of integrated circuit testing. More specifically, the present invention relates to a method and apparatus for improving the utilization of memory in integrated circuit testing systems.

2. Description of Related Art

Due to the high complexity of current semiconductor integrated circuits (ICs), testing of integrated circuits on automated test equipment (ATE) to detect manufacturing defects is a highly complex and costly task. Testing of each manufactured integrated circuit before it is shipped to a customer is essential, however, because a significant percentage of fabricated integrated circuits contain manufacturing defects, especially in case of large-scale integrated circuits fabricated using a state-of-the art manufacturing technology. Therefore, it is imperative to screen these defective chips out before they are shipped to a customer.

Today's ATEs test integrated circuits by applying the test patterns stored in the ATE memory to the IC under test and comparing the chip response to the expected response. In normal operation, ATEs apply a few bits of data to each input pin of the IC under test during every tester cycle. With current integrated circuits operating at clock cycles of hundreds of megahertz or gigahertz, a tester can potentially apply hundreds of millions of bits of data per chip pin within a second. However, ATE memory is a precious resource, and even a tester memory of 128 million bits per chip-pin is currently above the capacity of most available ATEs. ATE memory is expensive, because it needs to be a very high speed memory, and it is tied to the specific architecture of a particular ATE vendor. Moreover, an ATE typically has support for up to 512 chip pins via 512 separate ATE channels, and the associated ATE memory must be provided for every tester channel on the ATE. Therefore, it is crucial to utilize the tester memory as efficiently as possible while generating the test patterns to be stored in and applied by the ATE.

SUMMARY OF THE INVENTION

The method and apparatus of the present invention overcomes the shortcomings of the prior art by providing an improved ATE that decreases the number of test signals that must be stored in ATE pattern memory for a timed test pattern. The testing apparatus of the present invention is broadly comprised of a test pattern memory module that is operable to store a plurality of test signals for sequential transmission to an integrated circuit under test during a timed test pattern; a pin electronics module that is operable to transmit the plurality of test signals to the integrated circuit and to receive a plurality of output signals from the integrated circuit in response to the transmitted test signals; digital compare electronics for comparing the output signals to a predetermined reference output signal; and a timing generator operable to control the generation of the plurality of test signals during the timed test pattern. The timing generator is operable to change the timing interval of individual test cycles during the timed test pattern between first and second timing intervals, thereby decreasing the number of test signals stored in pattern memory during the timed test pattern.

A method of testing integrated circuits in accordance with the present invention comprises the steps of storing a plurality of test signals in the ATE pattern memory corresponding to a timed test pattern; generating a formatted, timed test pattern comprising the plurality of test signals corresponding to a sequence of test cycles; transmitting the test pattern to an integrated circuit under test; receiving a plurality of output signals from the integrated circuit in response to the test pattern; and comparing the output signals to a predetermined reference output signal. In the method of the present invention, the test pattern is controlled by a timing generator operable to change the timing interval of individual test cycles during the timed test pattern between first and second timing intervals, thereby decreasing the number of test signals stored in pattern memory during the timed test pattern.

The method and apparatus of the present invention can be implemented to test integrated circuits comprising circuitry operating in first and second time domains wherein the first and second timing intervals of the timed test pattern correspond to the first and second time domains of the circuit, respectively. In the present invention, the timing generator is operable to change the timing interval of individual test cycles during the timed test pattern, thereby decreasing the number of test signals stored in the pattern memory during the timed test pattern.

DETAILED DESCRIPTION OF THE INVENTION

Figure 1:
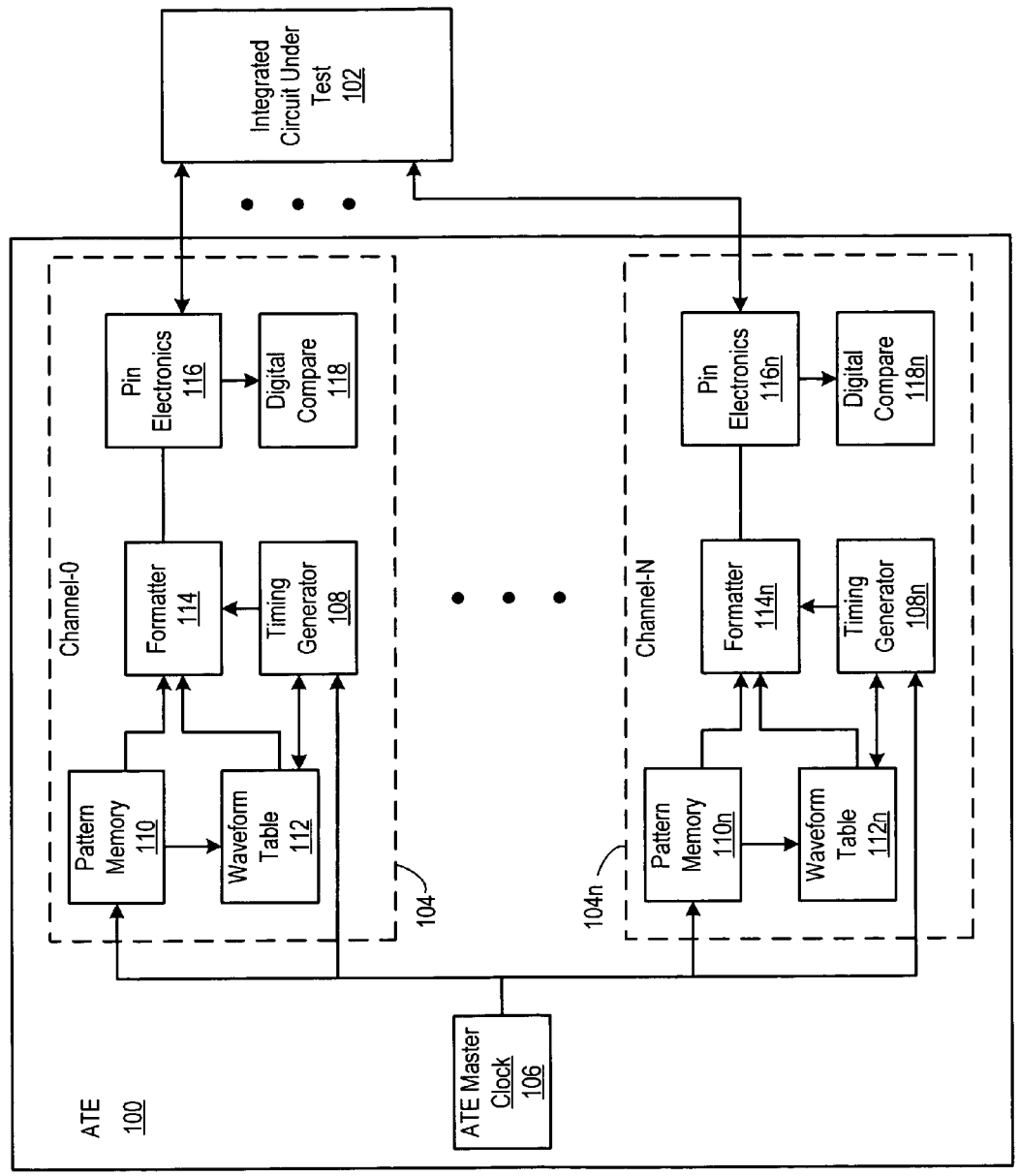
FIG. 1 is a schematic block diagram of an automatic testing system for testing integrated circuits.

FIG. 1 is a schematic illustration of the components of a typical digital automatic test equipment (ATE) system 100 for implementing the present invention to perform tests on an integrated circuit 102. The ATE comprises a plurality of test channels 0 . . . N, illustrated generally by channel 104, . . . 104n. All tester channels 104, . . . 104n are synchronized by the master ATE clock 106 which provides inputs to the timing generators 108, . . . , 108n and the pattern memories 110, . . . , 110n. The period of this clock determines the tester period, which is user programmable. Each ATE channel 104, . . . , 104n is connected to a separate pin of the integrated circuit under test 102. Pattern memories 110, . . . , 110n store data relating to the sequence of digital waveforms comprising the test signals to be applied to the integrated circuit 102. The formatters 114, . . . , 114n receive the outputs from the pattern memories 110, . . . , 110n and the waveform tables 112, . . . , 112n and provide formatted waveforms to the pin electronics 116, . . . , 116n. The pin electronics 116, . . . , 116n comprise the driver and receiver circuitry for transmitting signals to, and receiving signals from, the integrated circuit under test 102.

Figure 2:
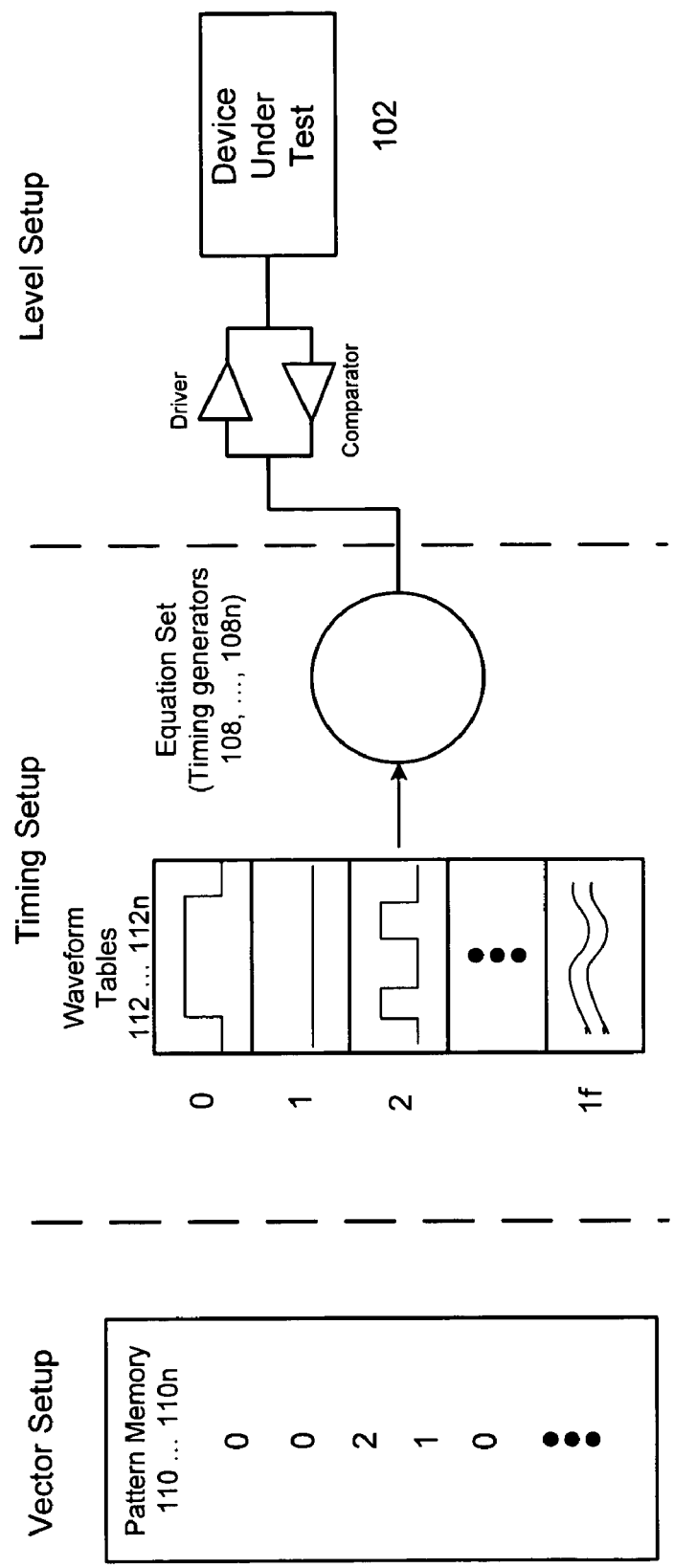
FIG. 2 is an illustration of the logical-functional components of the automatic test equipment of FIG. 1.

FIG. 2 illustrates the logical functions of the components shown in FIG. 1. The test vectors for the device under test 102 are determined by the test vectors contained in pattern memories 110, . . . , 110n. The waveform tables 112, . . . , 112n contain a list of basic digital waveform shapes which are referenced by each test vector in the pattern memories 110, . . . , 110n. The timing generators 108, . . . , 108n set the points within a tester period at which either waveform transitions occur or integrated circuit pin outputs are sampled by the pin electronics 116, . . . , 116n shown in FIG. 1. The samples received by the pin electronics 116, . . . , 116n are analyzed by the pin compare electronics 118, . . . , 118n and are compared to expected results to detect any errors in the circuits under test.

Details relating to the operation of automatic test equipment are discussed in the following publications: *Essentials of Electronic Testing for Digital, Memory, and Mixed-Signal VLSI Circuits* (Frontiers in Electronic Testing Volume 17) by Michael L. Bushnell, Vishwani D. Agrawal and Michael J. Bushnell, Kluwer Academic Publishers (2000); and *Digital Systems Testing and Testable Design*, by Miron Abramovici, Melvin A. Breuer and Arthur D. Friedman, John Wiley & Sons Publishers (1990). Each of the aforementioned publications is incorporated herein by reference for all purposes.

Figure 3:
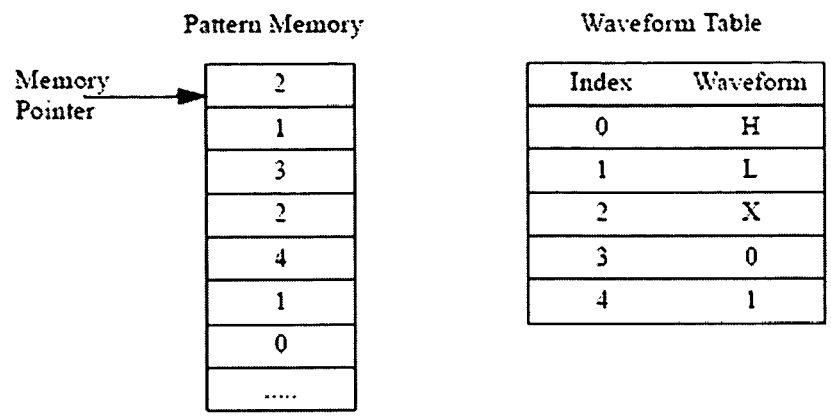
FIG. 3 is an illustration of a pattern memory and waveform table relating to the testing of integrated circuits in accordance with the method and apparatus of the present invention.
Figure 4:
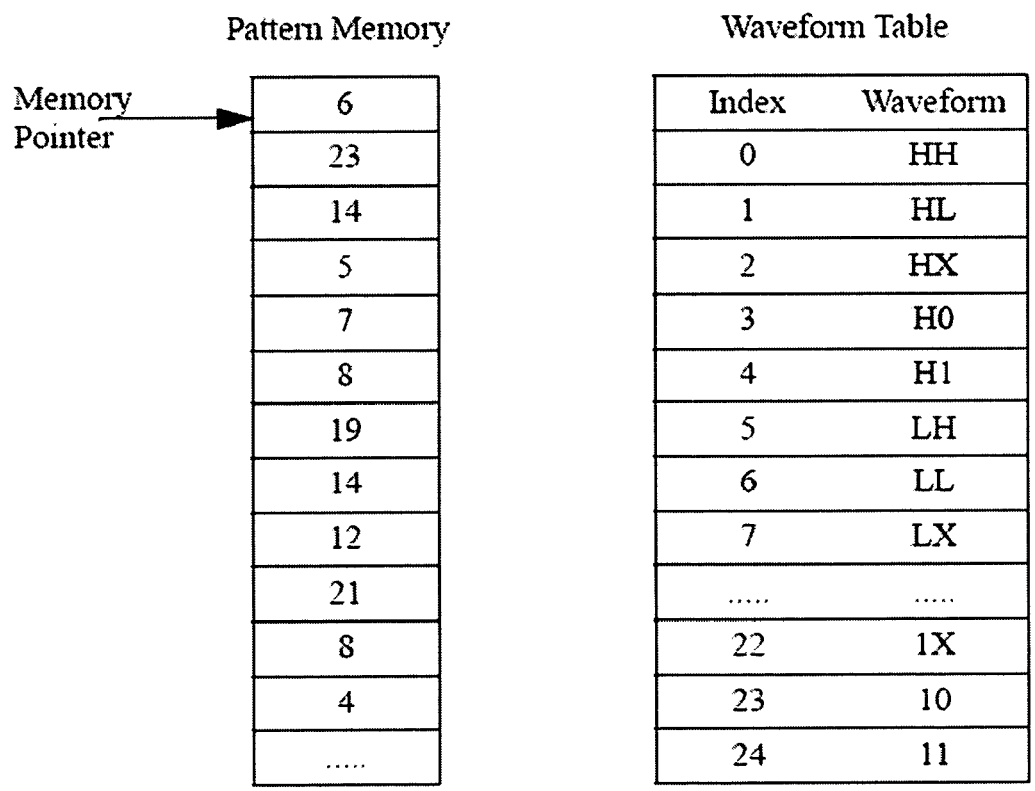
FIG. 4 is an illustration of a pattern memory and waveform table with complex shapes relating to the testing of integrated circuits in accordance with the method and apparatus of the present invention.

FIG. 3 and FIG. 4 illustrate the structure of the pattern memories 110, . . . , 110n and the waveform tables 112, . . . , 112n in more detail. For purposes of discussion of the basic waveform shapes in a waveform table, the following notations will be used: H means an expected logic-1 from the chip, L means an expected logic-0 from the chip, X means the output of the chip is to be ignored, 0 means to drive a logic-0 to the chip, and 1 means to drive a logic-1 to the chip.

FIG. 3 shows the contents of a waveform table, where each of these symbols constitutes a basic waveform shape. Each such shape has an associated index in the waveform table. The basic shapes in the waveform table can be more complicated, as shown in FIG. 4. However, there is a limit on the number of entries in the waveform table, which is usually small. For example, the Agilent 93000 tester has a limit of 32. Each memory location in the pattern memory illustrated in FIGS. 2 and 4 contains an index into the respective waveform tables illustrated in FIGS. 3 and 4. Every time the ATE master clock 106 advances to a new tester period, the memory pointer points to the next entry in the pattern memory and the corresponding waveform is applied in that tester cycle by the pin electronics illustrated in FIG. 1. The pattern memory in FIGS. 3 and 4 corresponds to the ATE pattern memories 110, . . . , 110n discussed in connection with FIG. 1. As discussed hereinabove, test patterns are stored in the pattern memories 110, . . . , 110n.

The method and apparatus of the present invention provides a substantial increase in the utilization efficiency of the pattern memories. Moreover, the method and apparatus of the present invention improves the efficiency of the ATE memories regardless of the types of waveforms stored in the waveform tables 112, . . . , 112n. For purposes of discussion, it can be assumed that the waveform table has only 4 basic waveforms, which are 0, 1, H, and L. The present invention provides the same savings in the pattern memory usage regardless of the basic waveforms used.

Figure 5:
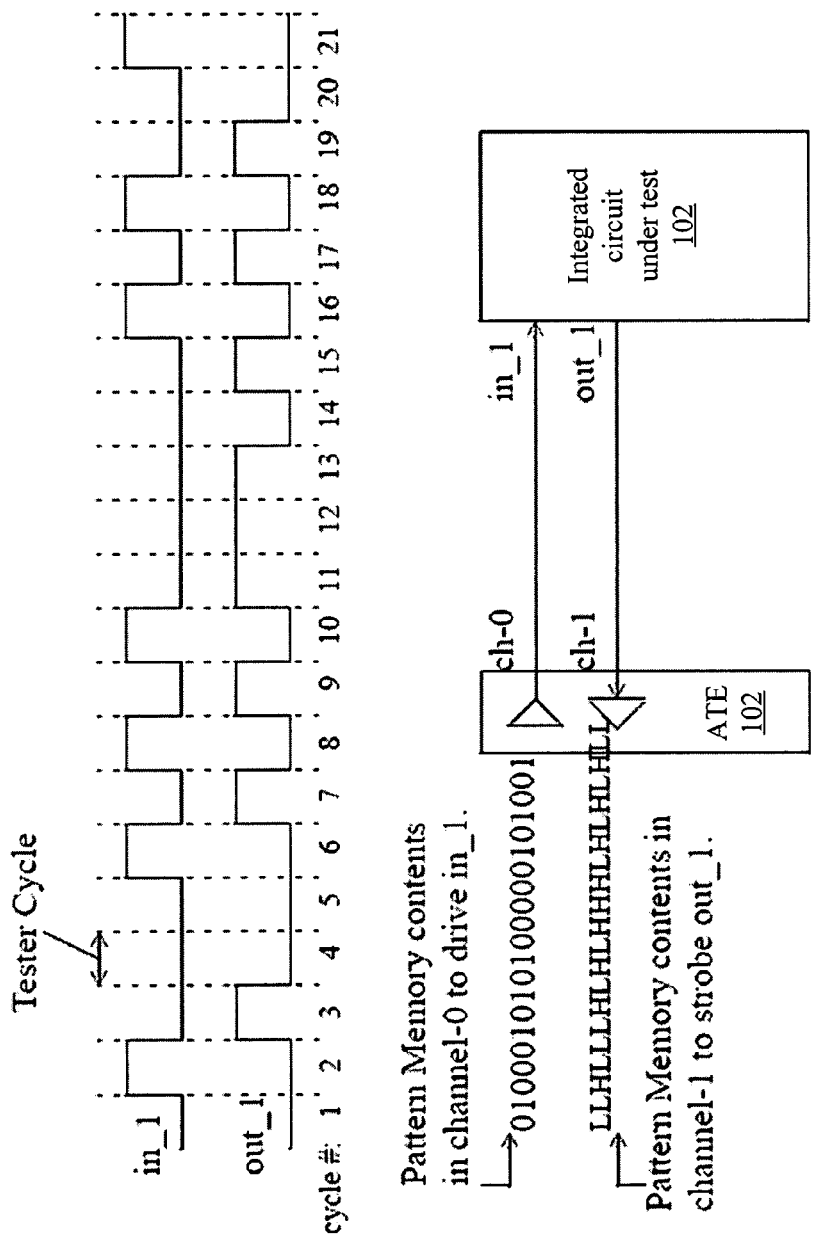
FIG. 5 is an illustration of a test pattern and associated pattern memory usage related to the testing of an integrated circuit.

FIG. 5 illustrates a simplified example of a test pattern transmitted by an ATE 100 and the output signal received from an integrated circuit under test 102 in response to the timed test pattern. Only two pins of the integrated circuit under test 102 are shown for simplicity: in_1 and out_1, which are connected to channel-0 and channel-1 of the ATE 100, respectively. The timing of these test signals is governed by the length of the cycle of the timed test pattern, which can be programmed to a desired value usually in units of nanoseconds or picoseconds on the ATE.

As will be understood by those of skill in the art, all ATE channels are synchronized to the same tester cycle via the ATE master clock 106. The waveform table symbols are used to show the contents of the pattern memory in one of the channels 104, . . . , 104n. The timed test pattern in FIG. 5 consists of 21 tester cycles; therefore, 21 units of data need to be stored in the pattern memories 110, . . . , 110n of each respective tester channel, 104, . . . , 104n, since in every new tester cycle the memory pointers shown in FIG. 3 and FIG. 4 advance to the next entry in the pattern memory. As will be understood by those of skill in the art, the test patterns illustrated in FIGS. 4 and 5 are for discussion purposes only. In an actual testing system, millions of bits of data are stored per tester channel.

Figure 6:
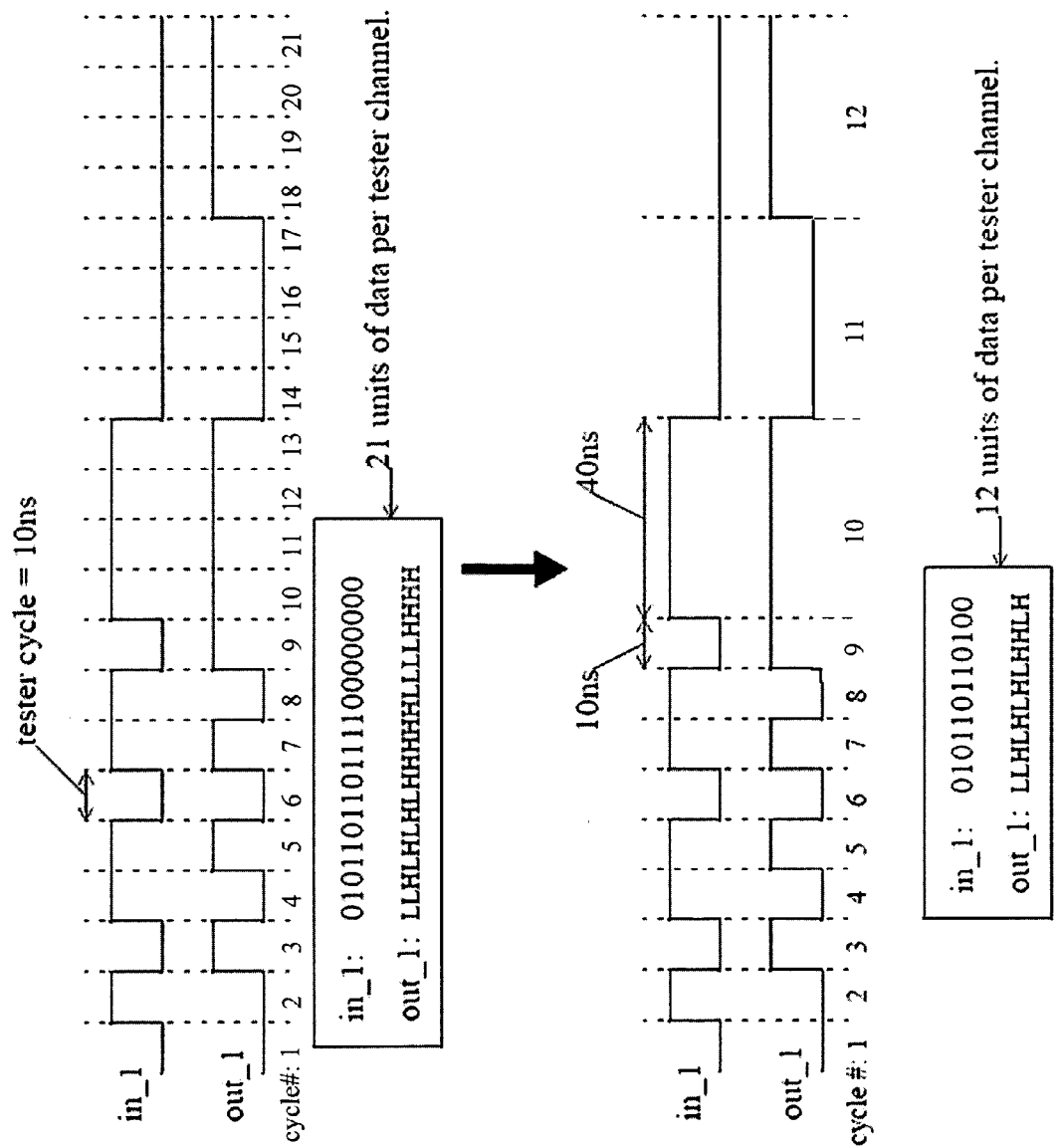
FIG. 6 is an illustration of a test pattern and associated memory usage resulting from changing the test cycle period of the timed test pattern.

In current complex system-on-chip integrated circuits, several clock domains exist for use by the circuit component in various modules within the integrated circuit. If, for a significant part of a test, only a slow clock is used to perform a required function, then the method and apparatus of the present can exploit this fact to significantly reduce the ATE memory requirement. Waveforms of an example test pattern are shown in the top portion of FIG. 6 for two pins of the integrated circuit under test 102. In this test, starting from cycle 10, the speed of the waveforms is reduced to ¼th of the initial speed. In other words, a waveform can make a transition only every other 4 tester cycles. Originally, each such waveform takes 21 units of memory space in the pattern memory per tester channel, as also shown in FIG. 5. In the lower part of FIG. 6, however, using the method and apparatus of the present invention, the length of the test cycle is switched from 10 ns to 40 ns in the middle of the timed test pattern starting at cycle 10. This cycle length is within the capability of most testers currently available. Using the method and apparatus of the present invention, the test pattern now takes only 12 units of memory space per tester channel, thereby giving a 75% savings over 21 units of pattern data to be stored if the method and apparatus of the present invention is not used.

The method and apparatus of the present invention can be utilized in the following ways: First, the present invention can be used to place more test patterns on an ATE without increasing its memory capacity. Alternatively, for testing environments that do not require an increase the number of test patterns, the same set of test patterns can use less tester memory, thereby enabling testing to be accomplished using less expensive ATEs with smaller memory capacity.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

The invention claimed is:

1. A testing apparatus, for testing the operation of an integrated circuit, comprising:
   pattern memory for storing test signals corresponding to individual test cycles within a timed test pattern;
   pin electronics connected to said integrated circuit, said pin electronics for transmitting a plurality of said test signals to said integrated circuit and receiving to a plurality of output signals from said integrated circuit in response to said test signals;
   digital compare circuitry for controlling said output signals to a predetermined reference output signal; and
   a timing generator for controlling the storing of said test signals during said timed test pattern;
   wherein said timing generator is for changing the timing interval of individual test cycles during said timed test pattern between first and second timing intervals, thereby decreasing the number of test signals stored in said pattern memory for said timed test pattern.

2. The testing apparatus according to claim 1, further comprising a waveform generator to generate a plurality of predetermined test waveforms corresponding to said test signals stored in said pattern memory.

3. The testing apparatus according to claim 2, further comprising a formatter to receive said test waveforms and to generate a formatted timed test pattern as an input to said pin electronics.

4. The testing apparatus according to claim 1, wherein said integrated circuit comprises circuitry operating in first and second time domains and wherein said first and second timing intervals of said timed testing pattern correspond to said first and second time domains of said circuit.

5. The testing apparatus according to claim 1, wherein said second timing interval is an integer multiple of said first timing interval.

6. A method of testing an integrated circuit, comprising:
   generating a timed test pattern comprising a plurality of test signals;
   storing said test signals corresponding to individual test cycles of said timed test a pattern in pattern memory;
   transmitting said timed test pattern to said integrated circuit;
   receiving a plurality of output signals from said integrated circuit in response to said timed test pattern;
   comparing said output signals to a predetermined reference output signal;
   wherein said timed test pattern is controlled by a timing generator for changing change the timing interval of individual test cycles during said timed test pattern between first and second timing intervals, thereby decreasing the number of test signals stored in said pattern memory for said timed test pattern.

7. The testing method according to claim 6, wherein said timed testing pattern comprises a plurality of waveforms generated by waveform generator to generate a plurality of predetermined test waveforms for storage in said pattern memory.

8. The testing method according to claim 7, wherein said timed test pattern is formatted by a formatter to receive said waveforms and to generate a formatted timed test pattern as an input to pin electronics connected to said integrated circuit.

9. The testing method according to claim 6, wherein said integrated circuit comprises circuitry operating in first and second time domains and wherein said first and second timing intervals of said timed testing pattern correspond to said first and second time domains of said circuit.

10. The testing method according to claim 9, wherein said second timing interval is an integer multiple of said first timing interval.

11. An integrated circuit, wherein during manufacturing of said integrated circuit, operational characteristics of said integrated circuit are tested by a testing apparatus, said testing apparatus comprising:
    pattern memory for storing test signals corresponding to individual test cycles within a timed test pattern;
    pin electronics connected to said integrated circuit, said pin electronics for transmitting transmit a plurality of said test signals to said integrated circuit and receiving a plurality of output signals from said integrated circuit in response to said test signals;
    digital compare circuitry for comparing said output signals to a predetermined reference output signal; and
    a timing generator for controlling storing the said test signals during said timed test pattern;
    wherein said timing generator for changing the timing interval of individual test cycles during said timed test pattern between first and second timing intervals, thereby decreasing the number of test signals stored in said pattern memory for said timed test pattern.

12. The integrated circuit according to claim 11, wherein said testing apparatus further comprises a waveform generator to generate a plurality of predetermined test waveforms for storage in said pattern memory.

13. The integrated circuit according to claim 12, wherein said testing apparatus further comprises a formatter to receive said test waveforms and to generate a formatted timed test pattern as an input to said pin electronics.

14. The integrated circuit according to claim 11, wherein said integrated circuit comprises circuitry operating in first and second time domains and wherein said first and second timing intervals of said timed testing pattern correspond to said first and second time domains of said circuit.

15. The integrated circuit according to claim 11, wherein said second timing interval is an integer multiple of said first timing interval.

16. An integrated circuit, wherein during manufacturing of said integrated circuit, operational characteristics of said integrated circuit are tested by a method, comprising:
    generating a timed test pattern comprising a plurality of test signals;
    storing said test signals corresponding to individual test cycles of said timed test a pattern in pattern memory;
    transmitting said timed test pattern to said integrated circuit;
    receiving a plurality of output signals from said integrated circuit in response to said timed test pattern;
    comparing said output signals to a predetermined reference output signal;
    wherein said timed test pattern is controlled by a timing generator for changing the timing interval of individual test cycles during said timed test pattern between first and second timing intervals, thereby decreasing the number of test signals stored in said pattern memory for said timed test pattern.

17. The integrated circuit according to claim 16, wherein said timed test pattern comprises a plurality of waveforms generated by waveform generator to generate a plurality of predetermined test waveforms for storage in said pattern memory.

18. The integrated circuit according to claim 17, wherein said timed test pattern is formatted by a formatter to receive said waveforms and to generate a formatted timed test pattern as an input to pin electronics connected to said integrated circuit.

19. The integrated circuit according to claim 16, wherein said integrated circuit comprises circuitry operating in first and second time domains and wherein said first and second timing intervals of said timed test pattern correspond to said first and second time domains of said circuit.

20. The integrated circuit according to claim 19, wherein said second timing interval is an integer multiple of said first timing interval.

* * * * *

UNITED STATES PATENT AND TRADEMARK OFFICE
CERTIFICATE OF CORRECTION

PATENT NO.      : 7,065,693 B2
APPLICATION NO. : 10/778753
DATED           : June 20, 2006
INVENTOR(S)     : Haluk Konuk Page 1 of 1

It is certified that error appears in the above-identified patent and that said Letters Patent is hereby corrected as shown below:

Column 5, line 11, in Claim 1: replace "controlling" with --comparing--.

Column 5, line 15, in Claim 1: delete "is".

Signed and Sealed this

Tenth Day of March, 2009

JOHN DOLL
*Acting Director of the United States Patent and Trademark Office*